United States Patent
Kaneko et al.

(10) Patent No.: US 6,411,387 B1
(45) Date of Patent: Jun. 25, 2002

(54) STAGE APPARATUS, PROJECTION OPTICAL APPARATUS AND EXPOSURE METHOD

(75) Inventors: Kenichiro Kaneko; Naoyuki Yamamoto, both of Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/667,702

(22) Filed: Sep. 22, 2000

Related U.S. Application Data

(63) Continuation of application No. 09/047,477, filed on Mar. 25, 1998, which is a continuation-in-part of application No. 08/990,581, filed on Dec. 15, 1997, now abandoned.

(30) Foreign Application Priority Data

Dec. 16, 1996 (JP) .............................................. 8-353269
Mar. 26, 1997 (JP) .............................................. 9-091461

(51) Int. Cl.⁷ ............................................... G01B 11/00
(52) U.S. Cl. ....................................... 356/401; 250/548
(58) Field of Search ................................ 356/401, 400, 356/399, 153, 371; 355/53; 250/548, 559.3

(56) References Cited

U.S. PATENT DOCUMENTS

| 4,770,531 A | 9/1988 | Tanaka et al. ............... 356/358 |
| 4,770,533 A | 9/1988 | Suwa ......................... 356/375 |

(List continued on next page.)

FOREIGN PATENT DOCUMENTS

| EP | 0 833 208 A2 | 4/1998 | |
| EP | 0 848 299 A2 | 6/1998 | |
| JP | 59-161029 | 9/1984 | |
| JP | 7122472 | * 5/1995 | ........... H01L/21/27 |

OTHER PUBLICATIONS

Patent Abstracts of Japan, vol. 1998, No. 8, Jun. 30, 1998 & JP 10 074687 A (Nikon Corp), Mar. 17, 1998.
Patent Abstracts of Japan, vol. 1998, No. 8, Jun. 30, 1998 & JP 10 070065 A (Nikon Corp), Mar. 10, 1998.

(List continued on next page.)

Primary Examiner—Frank G. Font
Assistant Examiner—Layla Lauchman
(74) Attorney, Agent, or Firm—Armstrong, Westerman & Hattori, LLP

(57) ABSTRACT

When a material support is moved along with a stage, coordinates of the position of the material support are measured by a measuring device. Displacement of the material support in the Z-direction as caused by the movement of the stage is stored in the storage in association with coordinates of corresponding position of the material support. When the flatness measurement is performed on a material piece placed on the material support while the stage is moved, the amount of such displacement of the material support in the Z-direction that is indicated by the displacement data in the storage and corresponds to the current position of the material support at each measurement point, may be read out from the storage and used as correction amount for correcting the position of the material support in the Z-direction. In this manner, the flatness measurement may be performed with the correction thus effected. Further, in the exposure method of the present invention, prior to loading of a photosensitive substrate on a movable stage, an amount of tilt relative to an image plane with respect to a projection optical system is measured at each of a plurality of positions on the movable stage. The measured amount of tilt is stored as data. After loading of the photosensitive substrate at a predetermined position on the movable stage for exposure, the position of the photosensitive substrate along an optical axis of the projection optical system is detected. Thereafter, a pattern on a mask is transferred to the photosensitive substrate, based on the detected position of the photosensitive substrate and the stored data on the amount of tilt of the movable stage.

11 Claims, 10 Drawing Sheets

U.S. PATENT DOCUMENTS

| | | | |
|---|---|---|---|
| 4,849,901 A | 7/1989 | Shimizu | 364/468 |
| 5,114,234 A | 5/1992 | Otsuka et al. | 356/358 |
| 5,182,615 A | 1/1993 | Kurosawa et al. | 356/400 |
| 5,238,870 A | 8/1993 | Tanaka | 437/173 |
| 5,461,237 A | 10/1995 | Wakamoto et al. | 250/548 |
| 5,473,424 A * | 12/1995 | Okumura et al. | 356/139.03 |
| 5,633,720 A | 5/1997 | Takahashi | 356/401 |
| 5,760,561 A | 6/1998 | Chinju et al. | 318/593 |
| 6,122,036 A * | 9/2000 | Yamasaki et al. | 355/53 |
| 6,172,373 B1 * | 1/2001 | Hara et al. | 250/548 |

OTHER PUBLICATIONS

Patent Abstracts of Japan, vol. 018, No. 063 (E–1500), Feb. 2, 1994 & JP 05 283310 A (Nikon Corp), Oct. 29, 1993.

Patent Abstracts of Japan, vol. 009, No. 010 (E–290), Jan. 17, 1985 & JP 59 161029 A (Nippon Denki KK), Sep. 11, 1984.

* cited by examiner

STAGE APPARATUS, PROJECTION OPTICAL APPARATUS AND EXPOSURE METHOD

CROSS REFERENCE TO RELATED APPLICATION

This application is a continuation of prior application Ser. No. 09/047,477 filed Mar. 25, 1998; which is a Continuation-in-part of Ser. No. 08/990,581 filed Dec. 15, 1997 now abandoned.

BACKGROUND OF THE INVENTION

The present invention relates to a stage apparatus, a projection optical apparatus and an exposure method. More particularly, the present invention relates to a stage apparatus including a material support capable of positioning a material piece carried thereon with at least three degrees of freedom, a projection optical apparatus including such a stage apparatus used as a positioning stage for a material piece, and an exposure method for transferring a pattern formed on a mask through a projection optical system by exposure to a photosensitive substrate loaded on a movable stage. One representative example of the above-mentioned projection optical apparatus is a projection exposure apparatus, such as a stepper, for use in a photolithographic process forming a part of the fabrication process of semiconductor devices, liquid crystal displays or other products. Another example is lens inspection equipment for measuring various aberrations associated with a projection optical system (or projection lens) equipped for such a projection exposure apparatus.

In photolithographic process for fabricating semiconductor devices, liquid crystal displays or other products, there have been used various projection exposure machines in which an exposure light beam is used to illuminate a mask or a reticle (a generic term "reticle" is used to mean either hereinafter) so as to transfer a pattern formed on the reticle through a projection optical system onto a photosensitive substrate. Further, in order to measure aberrations associated with a projection optical system equipped for such a projection exposure machine, there has been used lens inspection equipment in which various aberrations with the projection optical system are measured by making a projection exposure so as to transfer an image of a reticle pattern onto a photosensitive substrate and analyzing the exposure result (or the resulting pattern image formed on the photosensitive substrate.)

With these machines and equipment, a stage apparatus is typically used for positioning a material piece or substrate having a photosensitive layer coated on its surface. The substrate may typically comprise a silicon wafer or a glass plate (referred to simply as a "wafer" hereinafter). One common stage apparatus comprises an XY-stage capable of two-dimensional movement in a plane (typically, an XY-plane) and a material support (or Z-stage) for supporting a material piece or wafer thereon, the material support being mounted on the XY-stage and capable of displacing in the Z-direction perpendicular to the XY-plane.

By way of example, consider a demagnification projection exposure apparatus of the step-and-repeat type (commonly referred to as a "stepper"). In an exposure apparatus of this type, after the exposure of a shot-area, the wafer is moved or stepped to the next shot-area and the process is repeated until the entire surface of the wafer (or every shot-area on the wafer) has been processed to have reticle patterns transferred onto it. The stepping movement of the wafer is produced by the two-dimensional movement or translation of the XY-stage supporting that wafer.

With recent progress in the microminiaturization of circuit patterns exposure apparatuses are required to provide higher performance including an improved overlay accuracy as well as a higher resolution. Because a typical demagnification exposure apparatus uses a projection lens having a large numerical aperture (NA), its depth of focus is so small that a certain, appropriate mechanism must be provided for bringing with precision the surface of the wafer to a position at which it will be coincident with the image plane of the reticle pattern defined by the projection lens (such a mechanism may be, for example, an auto-focusing mechanism or a leveling mechanism). Also, it is desired to measure minute irregularities in the nominally flat surface of a wafer, or variation in height of the surface of a wafer placed on the stage among different points on the wafer surface. That is, wafer-flatness measurement is desired. Further, it is also desired to measure with accuracy various aberrations (such as, variation in depth of focus, curvature of image plane, tilt of image plane and others) associated with a projection optical system.

Wafer-flatness measurement, as well as the measurement of aberrations with the projection lens by lens inspection equipment, have been typically performed by using the positions of the moving XY-stage as the reference for the measurement. Specifically, in the case of wafer-flatness measurement, the XY-stage is driven so as to sequentially move the wafer into a number of predetermined measurement points arranged in a rectangular array or matrix, and the height (or the position in the Z-direction) of the surface of the wafer is measured at each measurement point. The Z-direction is perpendicular to the plane in which the XY-stage moves and is usually defined as the direction along the optical axis of the projection optical system.

Unfortunately, the surface of the wafer or material piece carried by the XY-stage may rise and sink (or displace in the Z-direction) while the XY-stage is driven (or more exactly an X-stage and/or a Y-stage, together composing the XY-stage, are driven) to move the wafer in the XY-plane. In the case where the drive mechanism for the stage comprises a feed screw in threading engagement with the stage and an electric motor for rotating the feed screw, such displacement in the Z-direction may be possibly caused by various factors, including minute irregularities in the nominally flat bearing surface along which the stage is guided, an inevitable play between the feed screw and the stage engaging with each other, some distortion induced in the feed screw, and others.

Therefore, the rise/sink of the stage produced when the stage is moved into different positions, or the displacement characteristic of the stage, often causes errors in the results of the wafer-flatness measurement and the lens-aberration measurement. Further, unlike the yaw of wafers which may be separately measured with ease by a yaw-measuring interferometer, it has been impossible to separately measure the displacement characteristic of the stage (or the rise/sink of the stage), with the result that the wafer-flatness measurement and the lens-aberration measurement have been performed so far, allowing for such errors.

Nevertheless, with the continuing increase in the complexity of present-day integrated circuits (ICs), the measurement errors caused by an undesirable displacement characteristic of the stage are becoming unacceptable, and it is almost certain that such measurement errors are not acceptable for the fabrication of the next generation of 64-megabit dynamic random access memories (DRAMs) any longer.

On the other hand, with respect to exposure apparatuses used in producing, for example, semiconductors, in order to transfer a pattern on a mask through a projection optical system to a photosensitive substrate with high accuracy, it is important to correct an amount of tilt of the photosensitive substrate which is provided on a movable stage, relative to an image plane with respect to the projection optical system. In a conventional exposure apparatus, in order to suppress variations in an amount of tilt of the movable stage during movement thereof, a stage-driving surface on which the movable stage is moved is machined with high precision according to the type of exposure apparatus, thereby flattening the stage-driving surface. However, in the above-mentioned conventional exposure apparatus, there is a disadvantage, such that correction of the amount of tilt of the movable stage is dependent on the degree of precision in machining the stage-driving surface, so that an improvement in accuracy of correction of the amount of tilt of the movable stage is limited. Further, due to the need for machining with high precision, production costs of stages become undesirably high.

In order to obviate such disadvantages, various countermeasures have been attempted. For example, Unexamined Japanese Patent Application Public Disclosure No. 5-283310 discloses an exposure method in which the amount of tilt of the surface of photosensitive substrate relative to the image plane with respect to the projection optical system is corrected in a global manner by a so-called EGL (Enhanced Global Leveling) method. In the EGL method, after a photosensitive substrate to be subjected to exposure is loaded on a stage, the amount of tilt (concave and convex) of the surface of the photosensitive substrate relative to the image plane with respect to the projection optical system is measured at a plurality of measurement sites. The amount of tilt of the entire surface of photosensitive substrate is determined statistically from the respective values of measurements at the plurality of measurement sites, and based on the thus determined amount of tilt, the tilt of the surface of photosensitive substrate is corrected.

However, in the above-mentioned EGL method, measurement of the amount of tilt of the entire surface of photosensitive substrate must be conducted by statistic calculations with respect to each photosensitive substrate after loading, so that a throughput becomes low.

In view of the foregoing, it is an object of the present invention to provide a stage apparatus which may provide an improved measurement accuracy in various measurement processes in which the positions of the moving stage are used as a reference for the measurement.

It is another object of the present invention to provide a stage apparatus which is capable of correcting for the rise/sink of the stage during such a measurement process.

It is a further object of the present invention to provide a stage apparatus which may improve measurement accuracy with the positions of the moving stage being used as the reference for the measurement.

It is a yet further object of the present invention to provide a projection optical apparatus which is capable of performing various measurement processes in which the positions of the moving stage are used as the reference for the measurement, such as the flatness measurement of a substrate, with great precision.

It is a yet further object of the present invention to provide an exposure method in which stages produced at low cost can be used and a high throughput can be achieved.

SUMMARY OF THE INVENTION

In accordance with the present invention, there is provided a stage apparatus comprising: a stage; a driver which drives the stage for movement in a direction along a first axis in a predetermined plane; and a first measuring device which measures an amount of displacement of the stage in a direction perpendicular to the predetermined plane, as caused by movement of the stage in the direction along the first axis.

The above-mentioned stage apparatus may further comprise: a second measuring device which measures a coordinate of a position of the stage in the direction along the first axis; and a memory which stores displacement data indicative of the amount of displacement of the stage in the perpendicular direction, as caused by movement of the stage in the direction along the first axis, in association with the coordinate of the position of the stage in the direction along the first axis.

The second measuring device may further measure a coordinate of the position of the stage in a direction along a second axis perpendicular to the first axis in the predetermined plane and the memory may store displacement data of the amount of displacement of the stage in the perpendicular direction, as caused by movement of the stage in the predetermined plane, in association with the coordinate of the position of the stage in the direction along the first axis and the coordinate of the position of the stage in the direction along the second axis.

The amount of displacement of the stage in the perpendicular direction may be derived by an arithmetic operation, based on distance data indicative of a distance in the perpendicular direction between a surface of a plane-parallel surface-mirror placed on the stage and a predetermined reference point as measured while moving the stage with predetermined intervals in the predetermined plane.

The above-mentioned stage apparatus may further comprise an adjuster which adjusts the position of the stage in the perpendicular direction depending on the amount of displacement of the stage in the perpendicular direction, while the stage is moved.

The above-mentioned stage apparatus may further comprise an arithmetic operation system, and when the stage is moved to a position for which the displacement data in the memory contains no displacement data indicative of the amount of displacement of the stage, the arithmetic operation system may derive the amount of displacement of the stage at the position for which the displacement data in the memory contains no displacement data indicative of the amount of displacement of the stage, by performing interpolation on the displacement data in the memory.

In the above-mentioned stage apparatus, the stage may include a material support which is capable of being displaced by a minute amount in the perpendicular direction, the first measuring device may measure the amount of displacement of the material support in the perpendicular direction, as caused by movement of the stage in the predetermined plane, and the second measuring device may further measure a coordinate of a position of the material support in the direction along the first axis and a coordinate of the position of the material support in the direction along the second axis.

In accordance with the present invention, there is also provided a method of moving a stage, comprising the steps of: moving the stage in a predetermined plane; measuring an amount of displacement of the stage in a direction perpendicular to the predetermined plane as caused by movement of the stage in the predetermined plane; and correcting displacement of the stage moved in the predetermined plane, based on the measured amount of displacement of the stage.

Further, in accordance with the present invention, there is provided an exposure apparatus comprising: a stage device which supports a photosensitive substrate placed thereon; a mask having a pattern formed thereon; an illumination device which illuminates the mask with an exposure light beam; and a projection optical system which projects the pattern on the mask to the photosensitive substrate in the presence of the exposure light beam, and the stage device may comprise a stage, a driver which drives the stage for movement in a direction along a first axis in a predetermined plane and a first measuring device which measures an amount of displacement of the stage in a direction perpendicular to the predetermined plane.

The above-mentioned exposure apparatus may further comprise: a second measuring device which measures a coordinate of a position of the stage in the direction along the first axis and a coordinate of the position of the stage in a direction along a second axis perpendicular to the first axis in the predetermined plane; and a memory which stores displacement data indicative of the amount of displacement of the stage in the perpendicular direction, as caused by movement of the stage in the predetermined plane, in association with the coordinate of the position of the stage in the direction along the first axis and the coordinate of the position of the stage in the direction along the second axis.

Still further, in accordance with the present invention, there is provided an exposure method comprising the steps of: moving a stage in a predetermined plane, the stage supporting a photosensitive substrate placed thereon; measuring an amount of displacement of the stage in a direction perpendicular to the predetermined plane as caused by movement of the stage in the predetermined plane; controlling a position of the stage in the perpendicular direction, based on the measured amount of displacement of the stage; and projecting a pattern formed on a mask to the photosensitive substrate.

The above-mentioned exposure method may further comprise a step of measuring coordinates of the position of the stage in the predetermined plane; and storing the measured coordinates of the position of the stage in association with the measured amount of displacement of the stage.

Still further, in accordance with the present invention, there is provided an exposure method for transferring a pattern formed on a mask through a projection optical system by exposure to a photosensitive substrate loaded on a movable stage, the projection optical system having an optical axis, comprising the steps of: measuring an amount of tilt of the movable stage relative to an image plane with respect to the projection optical system at each of a plurality of positions on the movable stage, prior to loading of a photosensitive substrate at a predetermined position on the movable stage; storing the measured amount of tilt of the movable stage; loading the photosensitive substrate at the predetermined position on the movable stage; detecting a position of the photosensitive substrate on the movable stage along the optical axis of the projection optical system; and transferring the pattern on the mask by exposure to the photosensitive substrate, based on the detected position of the photosensitive substrate and the stored amount of tilt of the movable stage.

In the above-mentioned exposure method, the step of measuring the amount of tilt of the movable stage may be conducted at each of a plurality of measurement points which are arranged on the movable stage in the form of intersection points of lines defining segments of a grid, the number of the segments of the grid being defined by the formula m×n in which each of m and n is an integer.

The above-mentioned exposure method may further comprise a height adjustment step of adjusting the position of the photosensitive substrate along the optical axis of the projection optical system so that the position of the photosensitive substrate along the optical axis of the projection optical system becomes coincident with an optimum image-forming position with respect to the projection optical system and a tilt correction step of correcting the amount of tilt of the movable stage so that the movable stage becomes in parallel to the image plane with respect to the projection optical system. The height adjustment step and the tilt correction step may be conducted at the same time.

In the exposure method of the present invention in which the amount of tilt of the stage is measured and stored as data prior to loading of the photosensitive substrate on the stage and leveling of the stage is conducted after loading of the photosensitive substrate by reading the stored data, it is unnecessary to conduct measurement of the amount of tilt with respect to each photosensitive substrate or each shot area to be subjected to exposure, so that a high throughput can be achieved. Further, differing from conventional techniques, the accuracy in measurement of the amount of tilt of the stage is not dependent on the degree of precision in machining the stage-driving surface, so that cost of production of stages can be reduced to a low level.

Still further, in accordance with the present invention, there is provided an exposure apparatus for transferring a pattern formed on a mask through a projection optical system by exposure to a photosensitive substrate loaded on a stage, the projection optical system having an optical axis, comprising: a measuring device which measures coordinates of a position of the stage in a predetermined plane; a tilt amount measuring device which measures an amount of tilt of the stage relative to an image plane with respect to the projection optical system; a memory which stores the amount of tilt of the stage in association with the coordinates of the position of the stage; a position measuring device which measures a position of a photosensitive substrate loaded on the stage along the optical axis of the projection optical system; and a driver which moves the stage, based on the position of the photosensitive substrate measured by the position measuring device and the amount of tilt of the stage stored in the memory.

In the above-mentioned exposure apparatus, the tilt amount measuring device may measure the amount of tilt of the stage at each of a plurality of predetermined positions to which the stage is moved and the exposure apparatus may further comprise a calculation system which calculates the amount of tilt of the stage at a position different from the plurality of predetermined positions by performing interpolation using the amount of tilt of the stage stored in the memory, when the stage is moved to the position different from the plurality of predetermined positions.

Still further, in accordance with the present invention, there is provided a method for making an exposure apparatus which transfers a pattern formed on a mask through a projection optical system by exposure to a photosensitive substrate loaded on a stage in the presence of illumination light emitted from a light source, comprising: providing a measuring device which measures coordinates of a position of the stage in a predetermined plane; providing a tilt amount measuring device which measures an amount of tilt of the stage relative to an image plane with respect to the projection optical system; providing a memory which stores the amount of tilt of the stage in association with the coordinates of the position of the stage; providing a position measuring device which measures a position of a photosensitive substrate loaded on the stage along the optical axis of the projection optical system; and providing a driver which moves the stage, based on the position of the photosensitive substrate measured by the position measuring device and the amount of tilt of the stage stored in the memory.

Still further, in accordance with the present invention, there is provided a method for making a stage apparatus, comprising the steps of: providing a stage; providing a driver which drives the stage for movement in a first direction in a predetermined plane; and providing a second measuring device which measures an amount of displacement of the stage in a second direction perpendicular to the predetermined plane as caused by movement of the stage in the first direction.

Still further, in accordance with the present invention, there is provided a method for making an exposure apparatus, comprising the steps of: providing a mask having a pattern formed thereon; providing a projection optical system which transfers the pattern on the mask to a photosensitive substrate; providing a stage which supports the photosensitive substrate placed thereon; providing a driver which drives the stage for movement in a first direction in a predetermined plane; and providing a second measuring device which measures an amount of displacement of the stage in a second direction perpendicular to the predetermined plane as caused by movement of the stage in the first direction.

The above and other objects, features and advantages of the present invention will be apparent from the following detailed description of preferred embodiments thereof, reference being made to the accompanying drawings.

DETAILED DESCRIPTION OF PREFERRED EMBODIMENTS

Referring to the accompanying drawings, preferred embodiments of the present invention will be described in detail.

Figure 1:
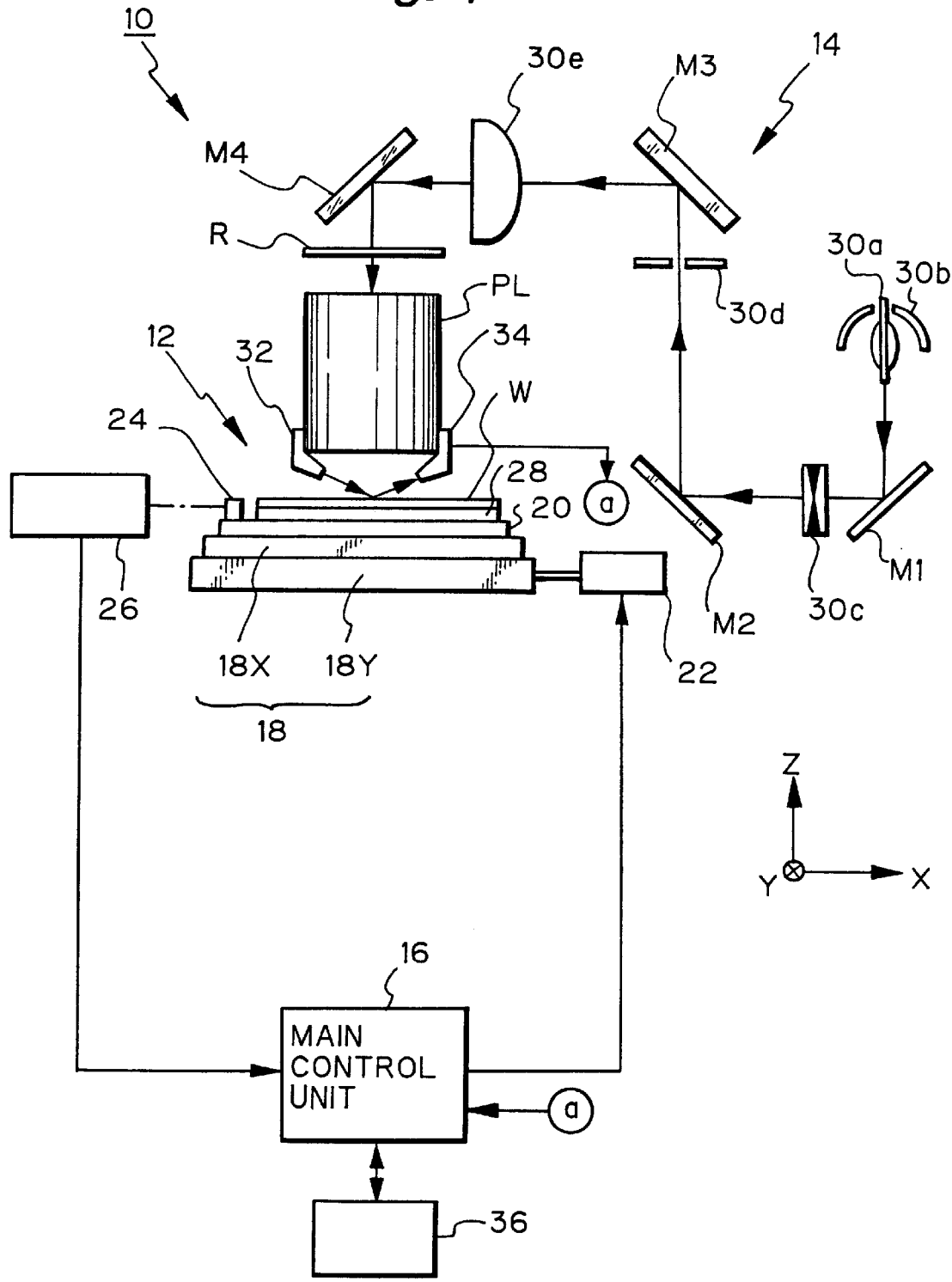
FIG. 1 is a schematic of a projection exposure apparatus according to an embodiment of the present invention, showing an implementation thereof for exposure process.

FIG. 1 is a schematic of a projection exposure apparatus 10 according to an embodiment of the present invention, which is a representative of various projection optical apparatus with which a stage apparatus according to the present invention may be used. The projection exposure apparatus 10 includes a wafer stage 12 for carrying thereon a photosensitive substrate or wafer W, a projection optical system PL disposed above the wafer stage 12, a master matrix of a pattern or reticle R held on a reticle holder (not shown) and disposed above the projection optical system PL, an illumination system 14 for illuminating the reticle R with an exposure light beam, and a main control unit 16 for providing general control of the entire projection exposure apparatus 10.

The wafer stage 12 comprises a first stage or XY-stage 18, which in turn comprises a Y-stage 18Y supported on a base (not shown) and movable in the Y-direction (perpendicular to the drawing sheet surface of FIG. 1) and an X-stage 18X supported on the Y-stage 18Y and movable in the X-direction (left-to-right direction as viewed in FIG. 1) perpendicular to the Y-direction. The wafer stage 12 further comprises a material support 20 carried on the X-stage 18X and movable in the Z-direction (perpendicular to the XY-plane) within a predetermined displacement range of, for example, 100 mm. The Y-stage 18Y, the X-stage 18X and the material support 20 are driven by means of a drive unit 22 for their movements in their own moving directions. The drive unit 22 includes a pair of drive mechanisms, one for each of the Y-stage 18Y and the X-stage 18X. The drive mechanism comprises a combination of a feed screw and an electric motor for rotating the feed screw. The drive unit 22 further includes a third drive mechanism (not shown) associated with the material support 20 for driving it to move or displace in the Z-direction. The material support and the associated drive mechanism together constitute a Z-stage for driving or displacing the wafer W on the material support 20 in the Z-direction. The drive mechanism associated with the material support 20 includes a built-in encoder for measuring the displacement of the material support 20 in the Z-direction, and the drive unit 22 uses the measured values output from the encoder when it drives the material support 20 in the Z-direction.

A pair of movable mirrors 24 (only one of them is shown in FIG. 1) are fixedly mounted on the material support 20. A pair of corresponding position-measuring devices or laser interferometer units 26 (again only one of them is shown in FIG. 1) are disposed each facing the associated one of the movable mirrors 24 for emitting a measuring beam (laser beam) toward the associated movable mirror 24 and using the reflection beam therefrom to measure the position of the material support 20 in the direction along its measuring beam. Specifically, the movable mirrors 24 include an X-direction movable mirror having its mirror surface extending perpendicular to the X-axis and a Y-direction movable mirror having its mirror surface extending perpendicular to the Y-axis. Similarly, the interferometer units 26 include an X-direction laser interferometer unit for measuring the position of the material support 20 in the X-direction and a Y-direction laser interferometer unit for measuring the position of the material support 20 in the Y-direction. However, in FIG. 1, only one movable mirror 24 and only one interferometer unit 26 are shown as representatives of the pairs. Thus, in the following description, it is assumed that the shown combination of the laser interferometer unit 26 and the movable mirror 24 provides the measurements of the two-dimensional, XY-coordinates of the position of the material support 20 with a high resolution of, for example, 0.01 mm. The measurements from the laser interferometer 26 are supplied to the main control unit 16.

A wafer holder 28 is mounted on the material support 20. The material piece or wafer W is held on the wafer holder 28 by means of vacuum suction, which may be provided, for example, by a vacuum chuck.

The illumination system 14 comprises a mercury lamp 30a serving as an illumination light source, an ellipsoidal reflector 30b, mirrors M1, M2, M3 and M4, a shutter 30c, a blind 30d, a condenser lens 30e and other elements not shown for simplicity. In operation, briefly, the mercury lamp 30a emits illumination rays, which are collected by the ellipsoidal reflector 30b into the region around the secondary focal point of the ellipsoidal reflector 30b. From the collected rays, only light of a selected wavelength for exposure purpose is passed through a suitable wavelength selector element (not shown) to form an illumination light beam, which then strikes on and is reflected by the mirror M1 into the shutter 30c. The wavelength may be selected, for example, to 364 nm where the light of i-line from the mercury lamp output should be used. When the shutter 30c is open, the illumination light beam (which is also an exposure light beam) is allowed to pass through the shutter 30c and reflected by the mirror M2 into an optical integrator (not shown) which may comprise a fly's eye lens. The illumination beam then passes through the blind 30d, is reflected by the mirror M3, passes through a relay lens system (not shown) and through the condenser lens 30e, and is again reflected by the mirror M4 to illuminate the reticle R. The optical integrator serves to improve uniformness in illuminance over the entire surface of the reticle R. The blind 30d is disposed at a position which is conjugate to the position of the pattern bearing surface of the reticle R and has an aperture which defines the outline of the illumination area produced on the surface of the reticle R.

As described, the reticle R is held on the reticle holder (not shown). The position of the reticle R is adjustable within an XY-plane by means of an adjustor mechanism (not shown). The reticle R has a circuit pattern (not shown) drawn on the under surface thereof, which extends in a plane which will be substantially, optically conjugate to the plane of the surface of the wafer W.

The projection optical system PL is mounted on and supported by a body column (not shown) of the projection exposure apparatus 10, with its optical axis extending in the Z-direction. The projection optical system PL used in the disclosed embodiment has double-side telecentricity with a selected demagnification ratio b (which may be selected, for example, to 1/4 or 1/5). Thus, when the reticle R is illuminated with the illumination beam from the illumination system 14, with the alignment between the reticle R and the wafer W been established, a reduced image of the pattern on the reticle is projected through the projection optical system PL onto the photoresist-coated wafer W for making exposure.

A focus detection system of the oblique incidence type is disposed by the projection optical system PL and comprises a light-beam-sending unit 32 and a light-beam-receiving unit 34. The focus detection system (32, 34) serves to measure the displacement of the surface of the wafer W in the direction along the optical axis of the projection optical system PL (thus, the displacement is the out-of-focus distance.) The detection signals output from the focus detection system (32, 34) are supplied to the main control unit 16.

The main control unit 16 comprises a microcomputer (alternatively, it may comprise a minicomputer) including a central processing unit (CPU), a read-only memory (ROM), a random-access memory (RAM) and other known components. The main control unit 16 controls the position of the XY-stage while monitoring the measurements from the laser interferometers 26, performs the wafer-flatness measurement process (described later in detail), controls the exposure operation, as well as provides other functions.

Further, with the projection exposure apparatus 10 according to the disclosed embodiment, the main control unit 16 is provided with a storage device 36 serving as storage means with a relatively great capacity. This storage device 36 is used to store the data indicative of displacement characteristic of the XY-stage in association with XY-coordinates of corresponding position of the material support, or the displacements of the material support 20 in the Z-direction corresponding to the positions of the material support 20 in the XY-plane. The values of such displacements, or the displacement data, are measured in advance in the manner described later, and stored in the storage device 36. The displacement data is read out from the storage device 36 by the CPU in the main control unit 16 and used for various measurement purposes. The displacement data may be used for the wafer-flatness measurement process, as described later, in order that the position of the material support 20 in the Z-direction should be corrected for such displacement through the drive unit 22.

Figure 2:
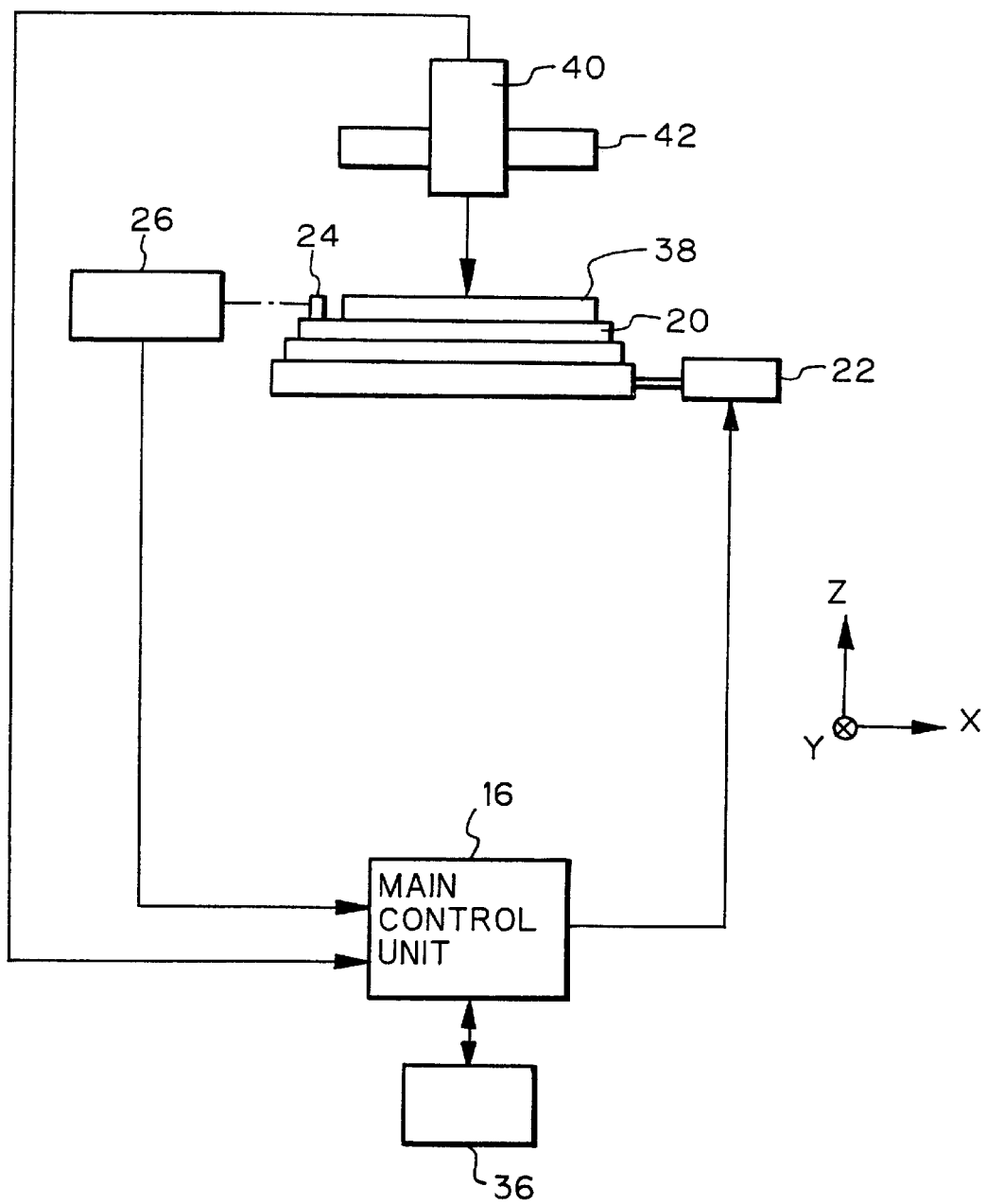
FIG. 2 is a schematic of the apparatus of FIG. 1, showing an implementation thereof for data acquisition process for data to be stored in a storage device of FIG. 1.
Figure 3:
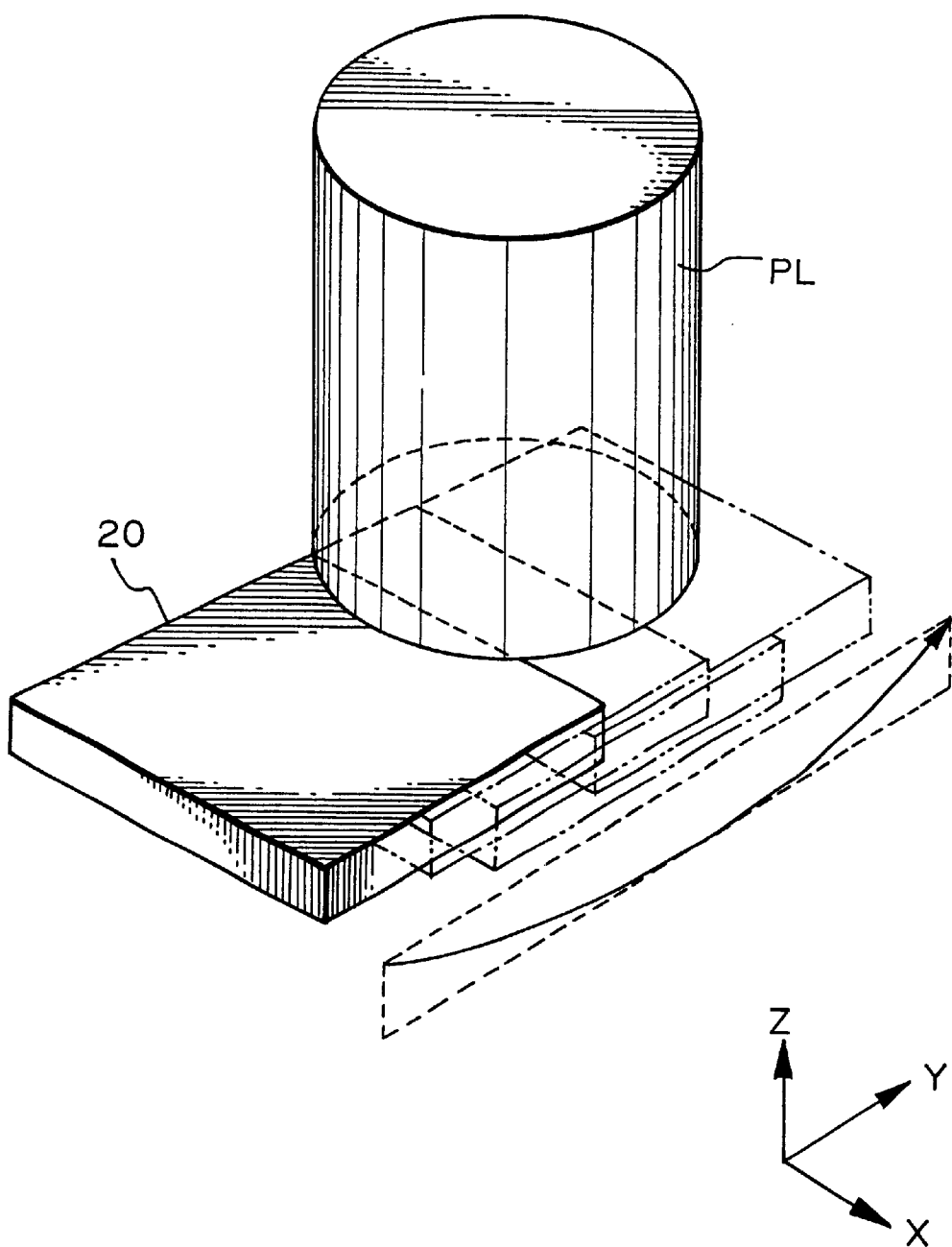
FIG. 3 illustrates a typical displacement of the material support of FIG. 1 in the Z-direction as produced when the XY-stage of FIG. 1 is moved in the direction along the Y-axis.
Figure 4:
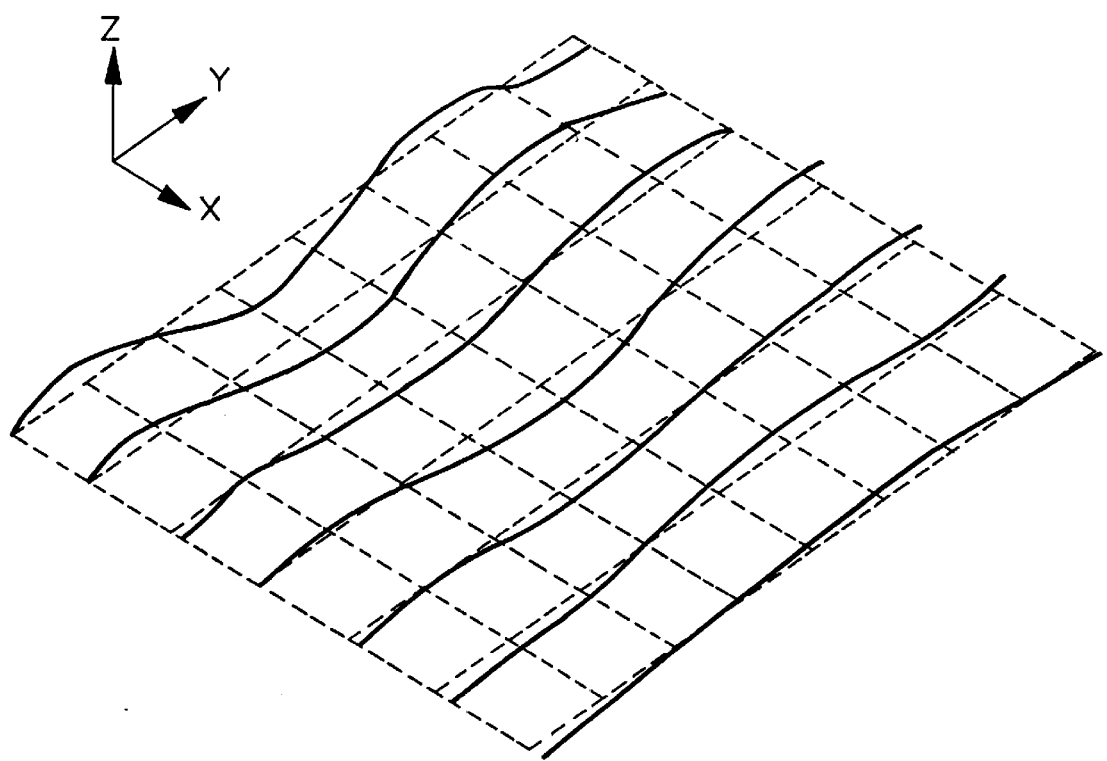
FIG. 4 illustrates a typical displacement of the material support as produced when the XY-stage is moved in the direction along the Y-axis, together with a number of measurement points arranged in a rectangular array or matrix.

Referring next to FIGS. 2 to 4, one exemplified method of measuring the displacement characteristic of the XY-stage 18 to be stored in the storage device 36 will be described in detail.

The measurement of the displacement characteristic of the XY-stage 18 is conducted before the projection optical system PL and the focus detection system (32, 34) are mounted to the projection exposure apparatus 10. FIG. 2 is a schematic of the projection exposure apparatus 10, showing an implementation thereof for this measurement. It is noted that the illumination system 14 has been already mounted to the projection exposure apparatus 10, but is not shown in FIG. 2 for simplicity.

As shown in FIG. 2, a reference mirror 38 is placed on the material support 20 instead of the wafer holder 28 with a wafer W thereon (FIG. 1). The reference mirror 38 comprises a plane-parallel surface-mirror having very high flatness of surfaces and with the upper surface thereof formed as a mirror surface. A distance-measuring laser interferometer unit 40 is disposed above the reference mirror 38 at a position which will be later occupied by the projection optical system PL. The laser interferometer unit 40 serves to measure the position in the Z-direction, and thus is referred to as the "Z-direction interferometer unit" hereinafter. The Z-direction interferometer unit 40 is mounted on the body column (not shown) through a fixture tool 42, with its measuring direction set in the Z-direction. The measurements output from the Z-direction interferometer unit 40 are supplied to the main control unit 16.

In order to measure the displacement characteristic of the XY-stage 18, the CPU in the main control unit 16 follows predetermined routines programmed and stored in the ROM so as to drive the XY-stage 18 along with the material support 20 through the drive unit 22 to cause two-dimensional movement of the material support 18 in the X-direction and/or Y-direction. In the two-dimensional movement of the XY-stage 18 (and thus of the material support 20), the XY-stage 18 is moved with predetermined step intervals in the XY-plane such that the material support 20 is sequentially positioned to a number of predetermined measurement points arranged in a rectangular array or matrix. For the positioning of the material support 20 to the measurement points the CPU monitors the measurements output from the laser interferometers 26, while it also measures the displacement of the material support 20 in the Z-direction in relation to its two-dimensional position in the XY-plane. Accordingly, the main control unit 16 reads the measured value output from the Z-direction interferometer 40 when the material support 20 is positioned at each measurement point and stores the measured value (indicative of the distance in the Z-direction from a reference pint) in the storage device 36 in association with XY-coordinates of the corresponding position of the material support 20 indicated by the outputs of the laser interferometers 26.

When the above measurement process is completed, displacement data has been obtained comprising the values of rise/sink of the material support 20 as caused by movement of the XY-stage 18 (and thus of the material support 20) and corresponding to the positions of the measurement points. Typical rise/sink of the material support 20 thus causes is schematically shown in FIG. 3 with exaggeration, together with the projection lens PL. An example of the rectangular array or matrix of the measurement points are shown in FIG. 4 in which intersections between broken lines are the predetermined measurement points. The displacement data indicative of the displacements of the material support 20 in the Z-direction that correspond to respective positions of the material support 20 in the XY-plane, which would also correspond to the predetermined measurement points, is stored in the storage device 36 in association with the XY-coordinates of the corresponding positions of the material support 20. The data may be stored in any appropriate form, such as a look-up table.

The solid-line curves in FIG. 4 visually illustrate, by way of example, how the rise/sink of the XY-stage 18 would be measured through the above measurement process.

The displacement characteristic of the XY-stage 18 can be measured more exactly if the distance between two adjacent measurement points (indicated as intersections between broken lines in FIG. 4) is reduced to increase the number of the measurement points. This may require, however, a longer time to complete the measurement process for acquisition of the displacement data, which may be possibly disadvantageous.

In order to avoid an unacceptable increase in the number of the measurement points, it is preferable that the main control unit 16 should perform arithmetic operation on the measured values in the displacement data obtained at a limited number of measurement point, by interpolating between measured values at adjacent measurement points using an appropriate interpolation technique, such as approximate functional interpolation, linear interpolation and spline interpolation, so that displacement values of the material support 20 in the Z-direction for the additional points in the XY-plane distributed over the entire moving range of the XY-stage 18 may be derived. Then, the values thus derived can be stored in the storage device 36 in association with the coordinates of the corresponding positions of the material support 20 in the XY-plane. In this manner, displacement data approximating the actual rise/sink of the XY-stage 18, such as shown in FIG. 4 by solid-line curves, may be obtained without consuming a long time for the measurement process for acquisition of displacement data.

It is further preferable that the irregularities in the shape of the nominally flat top surface of the reference mirror 38 are measured through an appropriate surface shape measuring means, such as a Fizeau interferometer, before the measurement process for acquisition of the displacement data. Then, the displacement values, whether measured or derived by interpolation, are corrected for the measured irregularities (by subtracting/adding the irregularity values from/to the displacement values for the corresponding XY-coordinates) before the displacement data is stored in the storage device 36. More specifically, this may be preferably performed by placing the reference mirror 38 on the material mirror 20 as would be in the process of the measurement for displacement data acquisition, using a Fizeau interferometer to conduct the measurement process for acquisition of the data indicative of the irregularities in the surface shape of the reference mirror 38 (or surface-shape data), and storing this surface-shape data either in the storage device 36 or in appropriate storage locations in the RAM in association with the XY-coordinates of the measurement points from an arbitrarily chosen reference point.

Referring again to FIG. 1, the operation steps for the wafer-flatness measurement process conducted with the projection exposure apparatus 10 of the disclosed embodiment having the above-described arrangement will be described in detail.

As with the measurement process for displacement data acquisition (i.e., for the displacement characteristic of the XY-stage 18), the CPU in the main control unit 16 follows predetermined routines programmed and stored in the ROM so as to drive the XY-stage 18 along with the material support 20 through the drive unit 22 to cause two-dimensional movement of the material support 18 in the X-direction and/or Y-direction. In the two-dimensional movement of the XY-stage 18 (and thus of the material support 20), the XY-stage 18 is moved with predetermined step intervals in the XY-plane such that the material support 20 is sequentially positioned to a number of predetermined measurement points arranged in a rectangular array or matrix. For the positioning of the material support 20 to the measurement points the CPU monitors the measurements output from the laser interferometers 26. Further, the main control unit 16 reads the measured value output from the focus detection system (32, 34) when the material support 20 is positioned at each measurement point. Before reading the measured value, the main control unit 16 retrieve the displacement value corresponding to that measurement point (or corresponding to the current position of the material support 20 indicated in terms of XY-coordinates, as seen from the current measured values output from the laser interferometers 26) contained in the displacement characteristic of the stage (or the data of displacement in the Z-direction) stored in the storage device 36. The retrieved displacement value is used as the correction amount, such that the drive unit 22 is so controlled as to adjust the position of the material support 20 in the Z-direction to correct for the displacement, and thereby prevent the rise/sink of the XY-stage 18 from affecting the position of the material support 20 in the Z-direction. In order to retrieve from the storage device 36 the displacement value in the displacement characteristic of the stage that corresponds to the measured values output from the laser interferometers 26, the main control unit 16 may use any suitable retrieval technique. For example, appropriate equations showing the relation between the storage locations for displacement values and the XY-coordinates of the positions corresponding to the displacement values may be used. Alternatively, an appropriate look-up table may be used to narrow the area of storage locations to be scanned for retrieval of the desired displacement value. Further, any other quick retrieval techniques may be also used.

After the retrieved value is used to adjust the position of the material support 20 in the Z-direction, the main control unit 16 reads the measured value (or the defocus signal) output from the focus detection system (32, 34) and store it in the storage device 36 in association with the corresponding measured values output from the laser interferometers 26.

In this manner, accurate wafer-flatness data obtained at the measurement points and without any influence of rise/sink of the XY-stage 18, is stored in the storage device 36 in association with the XY-coordinates of the corresponding measurement points in an appropriate form, such as a look-up table.

If the predetermined measurement points for the wafer-flatness measurement are denser than those for the measurement for the displacement characteristic of the stage, the material support 20 will be positioned in the process of the wafer-flatness measurement to such positions for which the displacement data in the storage device 36 contains no displacement value of the material support 20 in the Z-direction. In this case, the main control unit 16 derives the displacement value corresponding to the XY-coordinates of such position, through a real-time arithmetic operation, from the displacement values corresponding to the measurement points adjacent to such position. The arithmetic operation may utilize an appropriate interpolation technique, such as approximate functional interpolation, linear interpolation and spline interpolation. Then, the displacement value thus derived is used as the correction amount, such that the drive unit 22 is so controlled as to adjust the position of the material support 20 in the Z-direction to correct for the displacement, and thereby prevent the rise/sink of the XY-stage 18 from affecting the position of the material support 20 in the Z-direction.

As will be clearly understood from the above description, in the disclosed embodiment, the stage apparatus of the present invention comprises the wafer stage 12, the movable mirrors 24, the laser interferometers 26, the drive unit 22, the main control unit 16 and the storage device 36. The main control unit 16 constitutes an arithmetic operation device, while the combination of the drive unit 22 and the main control unit 16 constitute an adjustor for adjusting the position of the XY-stage 18 and/or the material support 20.

As described above, with the projection exposure apparatus 10 according to the disclosed embodiment, any displacement (or rise/sink) of the material support 20 in the Z-direction as caused by the movement of the XY-stage 18 (and thus of the material support 20) in the X-direction and/or the Y-direction, due to irregularities in the nominally flat guiding surface for the XY-stage or other causes, may be corrected for based on the data in the storage device 36 when the XY-stage 18 (and the material support 20) is moved. Therefore, when the wafer-flatness measurement process is performed, the wafer-flatness may be measured by the focus detection system (32, 34) after the necessary correction to the position of the material support 20 at each measurement point, so that the wafer-flatness can be measured with higher accuracy. This effectively allows to meet severer precision requirements for accuracy in the wafer-flatness measurement, which are expected with respect to future microminiaturization of semiconductor devices.

The disclosed embodiment has been described specifically with reference to the wafer-flatness measurement; however, the application of the present invention is not limited thereto. In fact, the stage apparatus of the present invention may be used to improve measurement accuracy in any of the measurement processes in which the positions of the moving stage are used as the reference for the measurement. For example, in the measurement process where the results of a test exposure are used to measure any of various aberrations with the projection optical system (such as variation in depth of focus, curvature of image plane, tilt of image plane and others), the stage apparatus of the present invention may be used to adjust the position of the wafer surface in the direction along the optical axis of the projection optical system, so as to improve the measurement accuracy. Thus, the stage apparatus of the present invention may be advantageously used with lens inspection equipment, implemented as a projection optical apparatus, to which a projection optical system may be detachably attached.

Further, the stage apparatus of the present invention may be desirably used with a pattern inspection apparatus in which the coordinates of the position of a pattern formed on a reticle are measured using the positions of the moving stage as the reference for the measurement. In addition, it may be desirably used with a laser beam machining apparatus for repairing defective memory chips by breaking fusible links therein to replace defective circuit elements with redundant circuit elements.

Although in the disclosed embodiment the X-stage and the Y-stage are driven through the drive mechanisms having mechanical connections and including a feed screw engaging the corresponding stage and an electric motor for rotating the feed screw, any other types of drive mechanisms may be used as well, including those having nonmechanical connections. For example, a drive mechanism of noncontact type and thus having no mechanical connection at all may be used. One example of such noncontact-type drive mechanism uses a pair of air guides running on respective rails mounted on a base, and the Y-stage (or alternatively the X-stage) is mounted on the air guides and driven by a stepping motor. Further, a linear motor may be used in place of the stepping motor. When a linear motor is used for this purpose, the linear motor may comprise a number of solenoids mounted on the base and arranged in line along the rails for the air guides, and permanent magnets mounted on the air guides and disposed to face the solenoids. Any arrangements for driving the X- and Y-stages to move in the X- and Y-directions, respectively, may be also used, and such arrangements may include other types of noncontact-type driving mechanisms.

Wafers are sometimes finished with chemical mechanical planarization and/or chemical mechanical polishing so as to have surfaces of very high flatness. When such a wafer with highly flattened or planarized surfaces is measured for its flatness, it is expected that the wafer surface would prove itself to be a completely flat and uniform surface. However, there may be possibly foreign bodies such as dust particles between the under surface of the wafer and the top surface of the stage, so that nonuniformity in the wafer surface may be indicated by the results of the flatness measurement. This means that performing the flatness measurement on a highly flattened wafer may indicate any foreign bodies between that wafer and the underlying stage. Thus, in the case where some foreign bodies have adhered to the under surface of a wafer or the top surface of the stage during wafer changes with the stage, the presence of such foreign bodies may be checked during the wafer-flatness measurement process performed prior to the exposure process on that wafer. If the presence of such foreign bodies is actually indicated, they can be removed before the exposure process. Accordingly, a stable exposure process without any influence of foreign bodies may be ensured thereby.

In addition, while the disclosed embodiment has been specifically described with reference to the stage for carrying a wafer thereon used in an exposure apparatus of the step-and-repeat type, the present invention may be also used with an exposure apparatus of any scanning type, in which both a reticle stage carrying a reticle and a wafer stage carrying a wafer are moved in synchronism for making a scanning projection exposure for transferring the pattern formed on the reticle onto the wafer. When used with such an exposure apparatus, the present invention may be applied to the wafer stage as with the disclosed embodiment, as well as to the reticle stage.

In the disclosed embodiment, the data stored in the storage device and/or the data derived therefrom through arithmetic operation using an interpolation technique, is used to perform the real-time adjustment (or correction) operation to adjust (or correct) the position of the material support in the Z-direction prior to each reading of the measured value during the measurement process. Alternatively, as commonly done, the wafer-flatness measurement or other measurement processes may be completed to obtain all the measured values and then correction may be effected to the measured values based on the displacement data stored in the storage device, In this manner, the wafer-flatness measurement may be performed with high accuracy as well.

As apparent from the above, the present invention provides an excellent advantage that the measurement accuracy may be improved in various measurement processes in which the positions of the moving stage are used as the reference for the measurement.

The stage apparatus of the present invention may further comprise an adjustor for adjusting, while the first stage is moved, the position of the material support in the direction along the first axis, depending on the amount of such displacement of the material support in the direction along the first axis that is indicated by the displacement data and that corresponds to the current position of the material support. Such a stage apparatus provides not only the above advantages but also the capability of correcting for rise/sink of the stage during a measurement process.

The stage apparatus of the present invention may further comprise an arithmetic operation device for performing interpolation on the displacement data in the storage to derive the amount of such displacement of the material support in the direction along the first axis that corresponds to the current position of the material support, when the first stage has been moved to such a position for which the displacement data in the storage contains no indication of displacement. Such stage apparatus may further improve the measurement accuracy for various measurement processes in which the positions of the moving stage is used as the reference for the measurement.

The stage apparatus of the present invention may be provided for a projection optical apparatus, in which a master matrix of a pattern is illuminated with an exposure light beam so that an image of the pattern on the master matrix is projected through an projection optical system onto a photosensitive substrate. In this case, the stage apparatus may be used as a stage for positioning a photosensitive substrate, so that various measurement processes using the positions of the moving stage as the reference for the measurement, such as the flatness measurement of a photosensitive substrate, may be performed with improved accuracy.

Hereinbelow, explanation is made on an exposure method in another aspect of the present invention.

Figure 5:
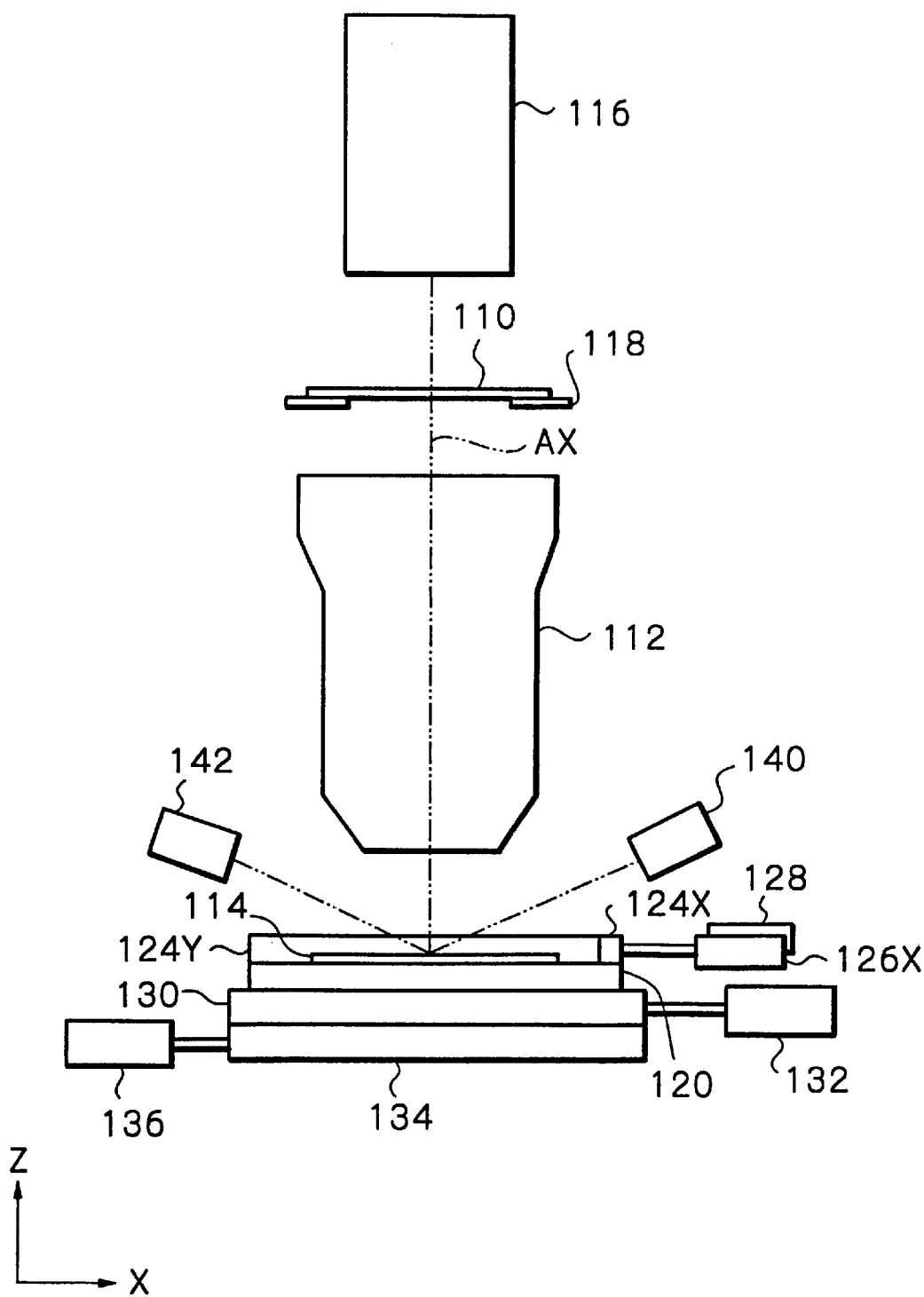
FIG. 5 is a general view of a construction of a projection exposure apparatus according to an embodiment of the present invention.

FIG. 5 shows a projection exposure apparatus according to an embodiment of the present invention. In this embodiment, the present invention is applied to a projection exposure apparatus for producing semiconductor devices, in which a pattern formed on a reticle 110 as a mask is transferred through a projection optical system 112 to a wafer 114 as a photosensitive substrate. In the projection exposure apparatus in this embodiment, exposure light exhibiting a uniform illuminance distribution is emitted from an illumination system 116 including a light source and irradiated to the reticle 110 held by a reticle holder 118. The pattern (not shown) to be transferred to the wafer 114 is formed on a lower surface of the reticle 110. An image of the pattern is projected through the projection optical system 112 to the wafer 114 at a predetermined demagnification.

Figure 6:
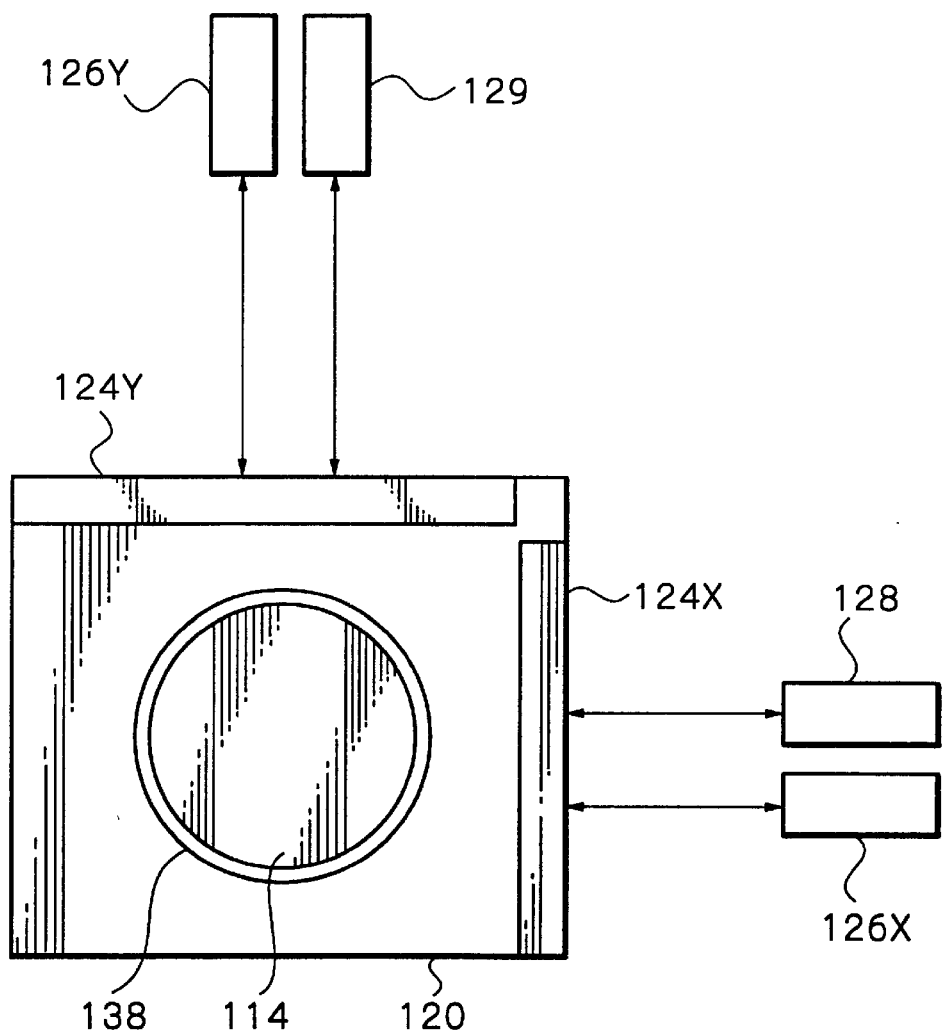
FIG. 6 is a plan view showing an arrangement of an area including a leveling stage in the projection exposure apparatus of FIG. 5.

The wafer 114 is held, for example, by suction, by a wafer holder 138 provided on a rectangular leveling stage 120 (see FIG. 6). Movable mirrors 124X and 124Y are provided on the leveling stage 120 along two sides thereof.

The movable mirrors 124X and 124Y are adapted to reflect laser beams emitted from laser interferometers 126X and 126Y, respectively (see FIG. 6). The laser interferometer 126X (hereinafter, frequently referred to as "X-axis laser interferometer 126X") is adapted to measure a coordinate of the position of the leveling stage 120 along an X-axis (which extends in a lateral direction in FIG. 5) and the laser interferometer 126Y (hereinafter, frequently referred to as "Y-axis laser interferometer 126Y") is adapted to measure a coordinate of the position of the leveling stage 120 along a Y-axis (which extends in a direction perpendicular to the plane of FIG. 5). The laser interferometers 126X and 126Y are, respectively, adapted to measure the coordinates of the position of the leveling stage 120 along the X-axis and the Y-axis, based on the interference of light reflected by fixed mirrors (not shown), which are fixedly provided in the projection optical system 112, with light reflected by the movable mirrors 124X and 124Y. As explained later, the leveling stage 120 is arranged in a manner such that the adjustment of the position of the wafer 114 along a Z-axis (vertically extending in FIG. 5) in parallel to an optical axis AX of the projection optical system 112 (hereinafter, frequently referred to simply as "focus adjustment") and correction of the amount of tilt of the leveling stage 120 (hereinafter, frequently referred to simply as "leveling") can be performed.

The leveling stage 120 is provided on an X-stage 130 which is capable of being moved in a direction of the X-axis (hereinafter, referred to simply as "X-direction") by an X-stage drive system 132. The X-stage 130 is provided on a Y-stage 134 which is capable of being moved in a direction of the Y-axis (hereinafter, referred to simply as "Y-direction") by a Y-stage drive system 136. A light emitting system 140 and a light receiving system 142, both constituting an oblique incidence type autofocus device, are provided at both sides of the projection optical system 112. A light beam having a slit-shaped cross-section is obliquely irradiated from the light emitting system 140 to the surface of the wafer 114 and reflected by the surface of the wafer 114. The reflected light beam is detected by the light receiving system 142. Using this autofocus device (comprising the light emitting system 140 and the light receiving system 142), the position of the surface of wafer 114 along the optical axis AX of the projection optical system 112 (the Z-axis) can be measured.

Next, referring to FIG. 6, explanation is made on an arrangement of an area including the leveling stage 120 in the projection exposure apparatus of FIG. 5. As is also shown in FIG. 5, a collimator 128 is disposed at a side of the X-axis laser interferometer 126X and a collimator 129 is disposed at a side of the Y-axis laser interferometer 126Y. The collimator 128 is adapted to emit light for measurement to the movable mirror 124X and measures the amount of tilt (tilt angle) of the leveling stage 120 in the X-direction, based on the light reflected by the movable mirror 124X. The collimator 129 is adapted to emit light for measurement to the movable mirror 124Y and measures the amount of tilt (tilt angle) of the leveling stage 120 in the Y-direction, based on the light reflected by the movable mirror 124Y. The measurements of amounts of tilt of the leveling stage 120 in the X-direction and the Y-direction (hereinafter, frequently referred to simply as "measurement of the amount of tilt of the leveling stage 120") are preliminarily conducted prior to loading of the wafer 114 on the leveling stage 120, that is, prior to exposure.

Figure 7:
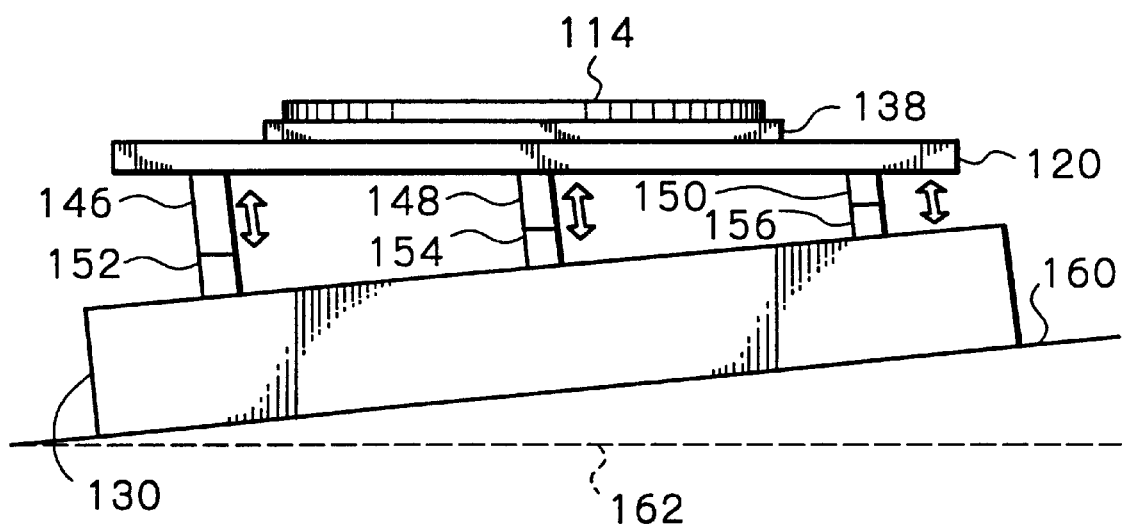
FIG. 7 is a side view showing the arrangement of the area including the leveling stage in the projection exposure apparatus of FIG. 5.

FIG. 7 shows an arrangement of a drive system for the leveling stage 120. 3 Direct-current motors (DC motors) 146, 148 and 150 are provided between the leveling stage 120 and the X-stage 130. Each of the DC motors 146, 148 and 150 is adapted to move the leveling stage 120 in a direction parallel to the optical axis AX of the projection optical system 112 (Z-direction). The DC motors 146, 148 and 150 are connected to encoders 152, 154 and 156, respectively, which are capable of monitoring amounts of rotation of the DC motors 146, 148 and 150. That is, the amount by which the leveling stage 120 is moved by the DC motors 146, 148 and 150 can be monitored, based on detection values of the encoders 152, 154 and 156. In this embodiment of the present invention, the DC motors 146, 148 and 150 are capable of being individually controlled and not only correction of the amount of tilt of the leveling stage 120 (leveling), but also adjustment of the position of the wafer 114 along the Z-axis (focus adjustment) can be conducted. Incidentally, reference numerals 162 and 160, respectively, denote an ideal stage-driving surface for the X-stage 130 (or the leveling stage 120), which is an image plane with respect to the projection optical system 112, and an actual stage-driving surface for the X-stage 130 (or the leveling stage 120). In FIG. 7, the actual stage-driving surface 160 for the X-stage 130 is tilted at an extremely large angle, relative to the ideal stage-driving surface 162. The stage-driving surface 160 for the X-stage 130 is the surface of the Y-stage 134 (see FIG. 5) which is tilted relative to the ideal stage-driving surface 162 for various reasons, such as poor machining accuracy.

Figure 8:
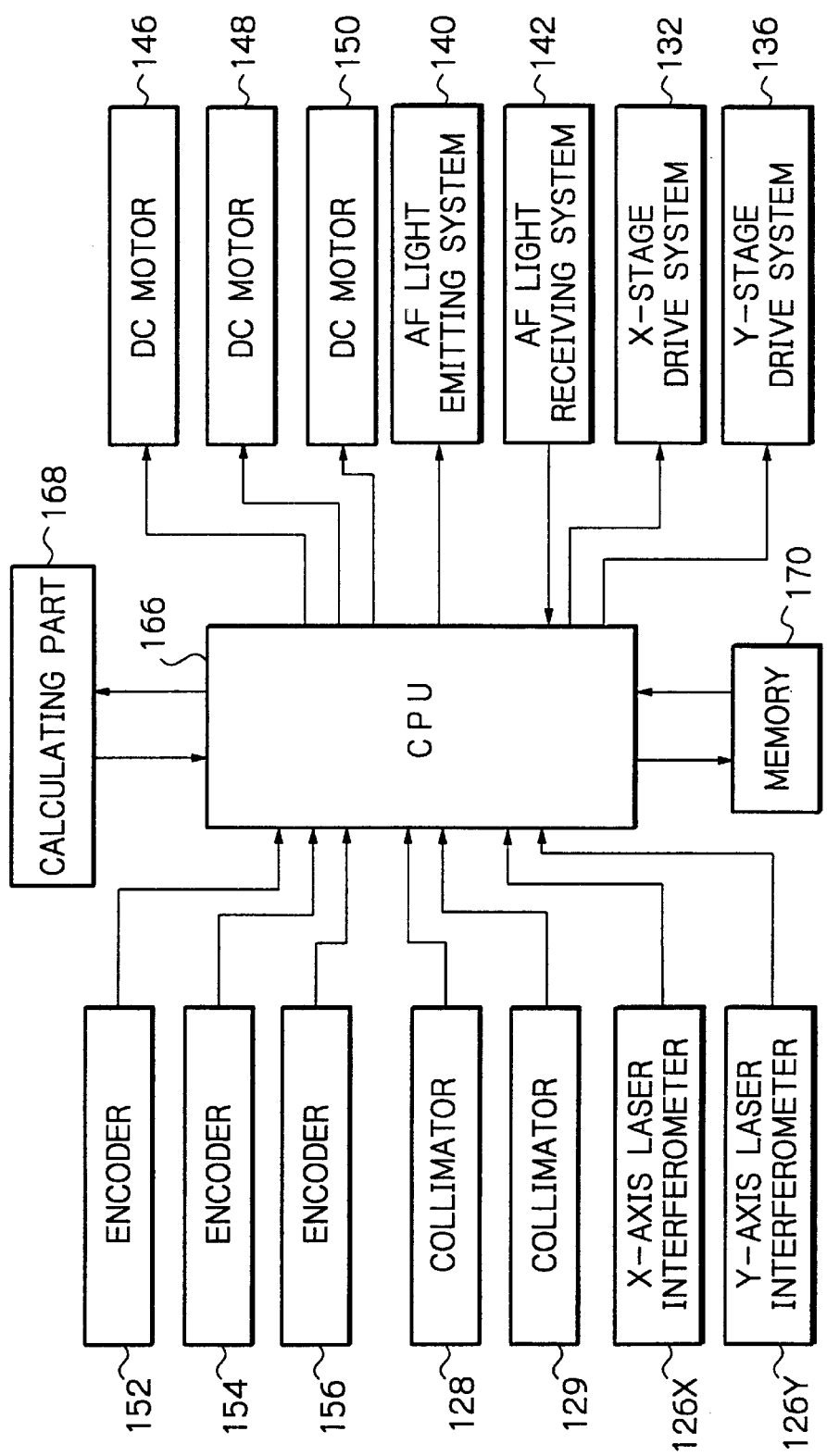
FIG. 8 is a block diagram showing an arrangement of a control system for leveling and focus adjustment conducted in the embodiment of the present invention.

Hereinbelow, an arrangement of a control system for leveling and focus adjustment in this embodiment is explained, with reference to FIG. 8. Reference numeral 166 denotes a CPU (central processing unit) adapted to comprehensively control the entire control system. The CPU 166 is connected to a calculating part 168 adapted to conduct predetermined calculations and a memory 170 adapted to store data with respect to the amount of tilt of the leveling stage 120. As mentioned above, the amounts of rotation of the DC motors 146, 148 and 150 are detected by the encoders 152, 154 and 156. Data with respect to the detected amounts of rotation of these DC motors is supplied from the encoders 152, 154 and 156 to the CPU 166. Data with respect to the position of the surface of wafer 114 along the Z-axis (data on height of the wafer 114) is supplied from the light receiving system 142 of the autofocus device (comprising the light emitting system 140 and the light receiving system 142) to the CPU 166. Data with respect to the amount of tilt of the leveling stage 120 is supplied from the collimators 128 and 129 to the CPU 166. Data with respect to the coordinates of the position of the leveling stage 120 in the X-Y plane is supplied from the X-axis laser interferometer 126X and the Y-axis laser interferometer 126Y to the CPU 166.

Figure 9:
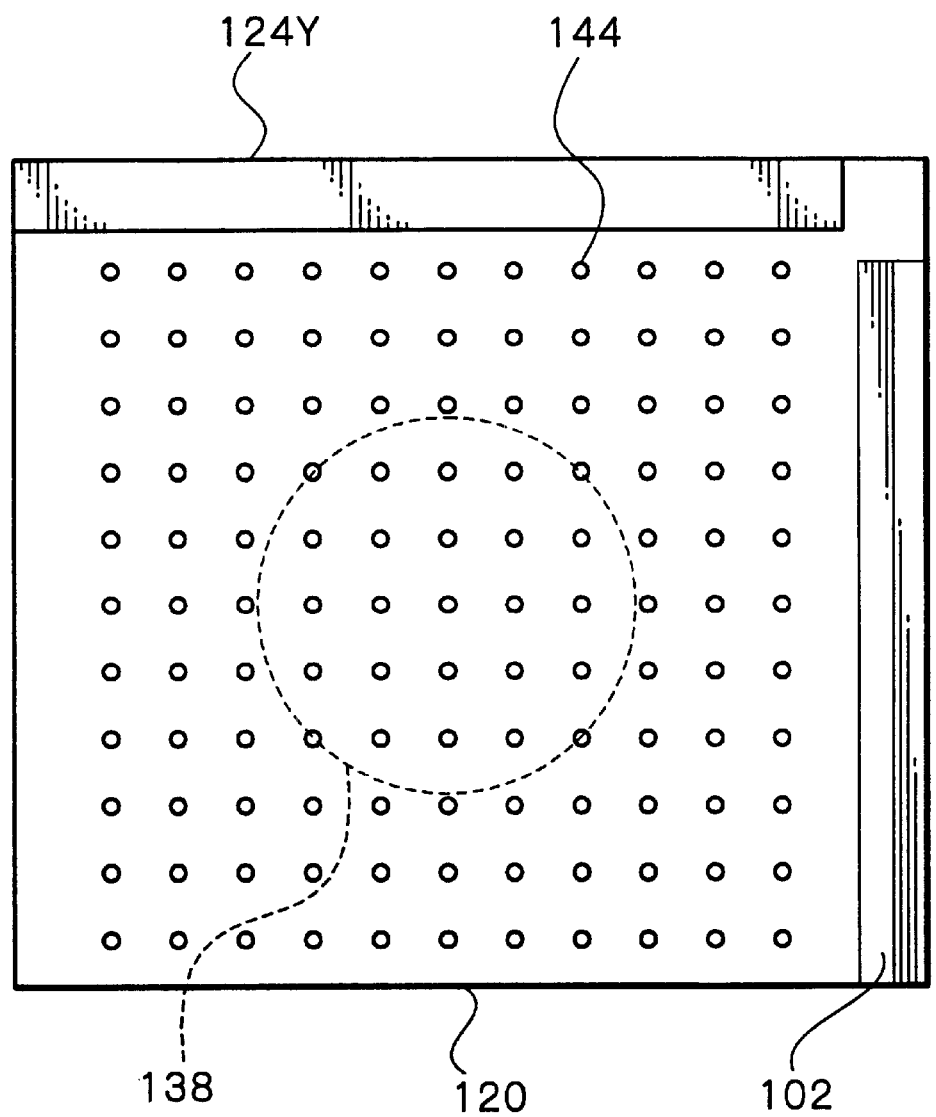
FIG. 9 is a top view of the leveling stage for explaining an arrangement of measurement points on the leveling stage for leveling in the embodiment of the present invention.

The CPU 166 stores, as map data, respective amounts of tilt at a plurality of positions on the leveling stage 120 in the memory 170, based on data supplied from the collimators 128 and 129 and the laser interferometers 126X and 126Y. With respect to measurement points for measurement of the amount of tilt of the leveling stage 120, for example, as shown in FIG. 9, measurement of the amount of tilt may be conducted with respect to each of a plurality of points 144, which are arranged on the leveling stage 120 in the form of intersection points of lines defining segments of a grid, in a region where the leveling stage 120 is capable of being moved. The number of segments of the grid on the leveling stage 120 is represented by the formula m×n, wherein each of m and n is an integer. In FIG. 9, the number of segments of the grid on the leveling stage 120 is (10×10). Prior to exposure, the amount of tilt may be measured with respect to each of these measurement points 144 on the leveling stage 120 by using the collimators 128 and 129. In the present invention, the number of segments of the grid on the leveling stage 120 is not limited to (10×10) and can be changed as desired. The positions of measurement points can also be changed.

When the wafer 114 is loaded on the leveling stage 120 for exposure, with respect to each shot area on the wafer 114, the CPU 166 reads data on the amount of tilt stored in the memory 170 and controls the calculating part 168 to calculate a tilt correction amount for the leveling stage 120 (the amount by which each of the DC motors is to be rotated for correcting the amount of tilt of the leveling stage 120) and while making reference to data from the encoders 152, 154 and 156, the CPU 166 rotates the DC motors 146, 148 and 150, to thereby correct the amount of tilt of the leveling stage 120. Further, the CPU 166 performs focus adjustment (adjustment of the height of wafer 114) by rotating the DC motors 146, 148 and 150, based on data with respect to a focus position (position of the wafer 114 along the Z-axis) from the light receiving system 142 of the autofocus device. That is, the CPU 166 enables an exposure surface of the wafer 114 to be located at an optimum image-forming position with respect to the projection optical system 112.

Figure 10:
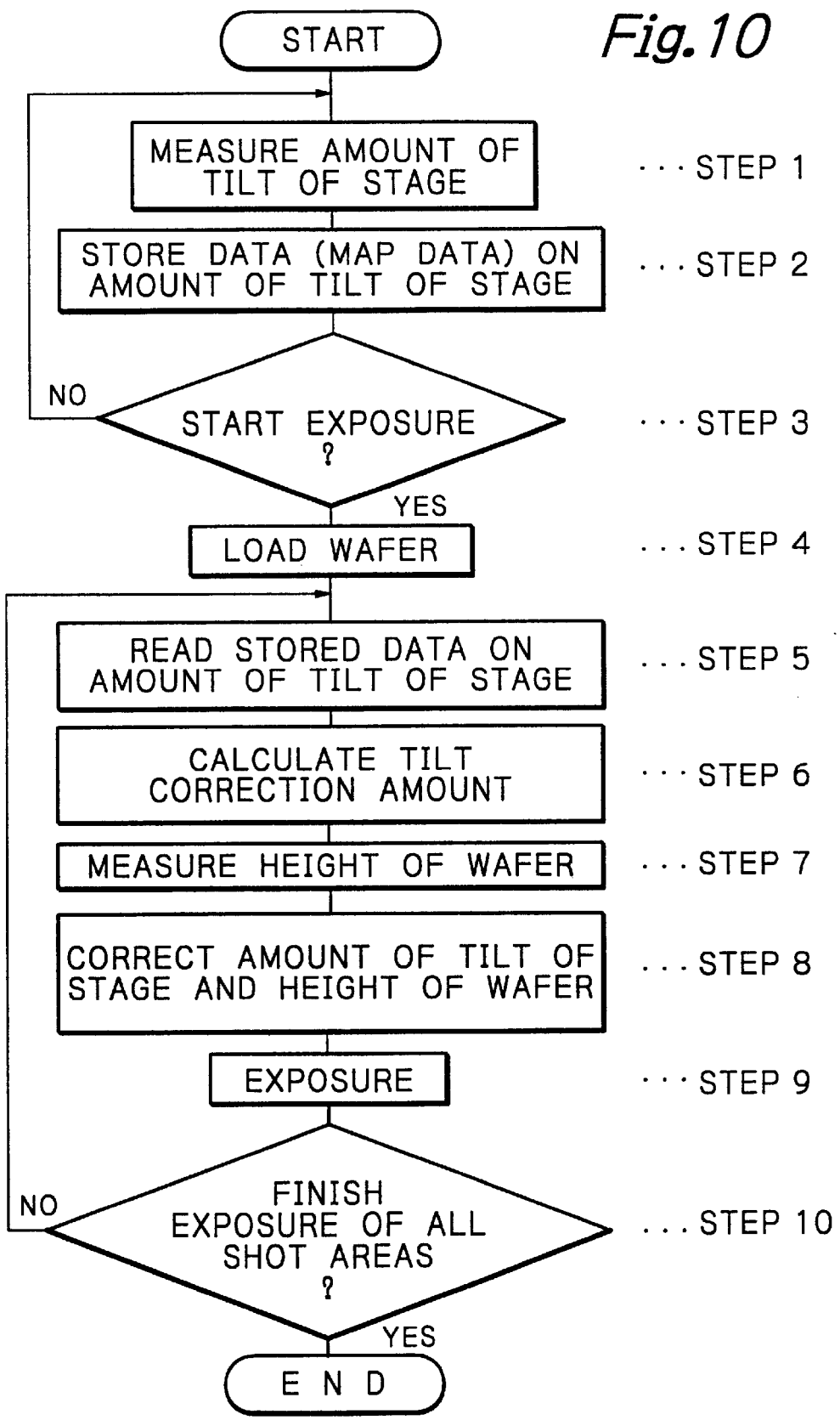
FIG. 10 is a flow chart showing how the exposure method according to the embodiment of the present invention is practiced.

Next, how the exposure method according to this embodiment of the present invention is practiced is explained, in accordance with a flow chart in FIG. 10. Prior to loading of the wafer 114 on the wafer holder 138, in a step 1, measurement is conducted with respect to the amount of tilt of the leveling stage 120. In this instance, the X-stage drive system 132 and the Y-stage drive system 136 drive the leveling stage 120 in the X-Y plane, based on data with respect to the coordinates of the position of the leveling stage 120 from the X-axis laser interferometer 126X and the Y-axis laser interferometer 126Y and data on the respective positions of measurement points 144 arranged on the leveling stage 120 in the form of intersection points of lines defining segments [number: m×n (each of m and n is an integer)] of a grid, which data has been preliminarily stored in the memory 170. Illustratively stated, the CPU 166 controls the X-stage drive system 132 and the Y-stage drive system 136 to move the leveling stage 120 so that the measurement points 144 on the leveling stage 120 are successively moved to a position for exposure on the optical axis AX of the projection optical system 112, and with respect to each measurement point 144 positioned on the optical axis AX of the projection optical system 112, the amounts of tilt in the X-direction and the Y-direction are measured by the collimator 128 and the collimator 129, respectively. In a step 2, the CPU 166 stores, as map data, the respective amounts of tilt at the measurement points 144 on the leveling stage 120 in the memory 170, based on data from the collimators 128 and 129.

Subsequently, when it is determined to conduct exposure (step 3), the wafer 114 is loaded on the wafer holder 138 on the leveling stage 120 (step 4). Then, the center of one shot area (area for exposure) on the wafer 114 is moved to the position for exposure on the optical axis AX of the projection optical system 112. In a step 5, the CPU 166 reads data on the amount of tilt stored in the memory 170. In a step 6, the CPU 166 controls the calculating part 168 to calculate the tilt correction amount for the leveling stage 120 with respect to the shot area with its center being located at the position for exposure. With respect to calculation of the tilt correction amount for the leveling stage 120, because the positions of measurement points 144 in FIG. 9 may not coincide with the centers of the shot areas on the wafer 114, the tilt correction amount for the leveling stage 120 with respect to one shot area is calculated by, for example, determining an average value of the amounts of tilt at a plurality of measurement points in the vicinity of the center of that shot area.

In a step 7, the CPU 166 actuates the light emitting system 140 and the light receiving system 142 of the autofocus device, to thereby detect the position of the wafer 114 along the Z-axis with respect to the shot area with its center being located at the position for exposure. The calculating part 168 calculates a correction amount for the position of the leveling stage 120 along the Z-axis (focus control amount), based on a signal from the light receiving system 142 of the autofocus device. Thereafter, while making reference to data supplied from the encoders 152, 154 and 156 through the CPU 166, the calculating part 168 calculates the amount by which each of the DC motors 146, 148 and 150 is to be rotated (amount of rotation of each of the DC motors 146, 148 and 150), based on the tilt correction amount and the correction amount for the position of the leveling stage 120 along the Z-axis.

In a step 8, the CPU 166 controls rotation of each of the DC motors 146, 148 and 150, based on the amount of rotation of each of the DC motors 146, 148 and 150 calculated by the CPU 166, so that adjustment of the position of the leveling stage 120 is conducted at three points at which the DC motors 146, 148 and 150 are provided, to thereby perform focus adjustment and leveling. That is, in the step 8, the CPU 166 enables the leveling stage 120 to become in parallel to the image plane with respect to the projection optical system 112 and also enables the position of exposure surface of the wafer 114 to become coincident with the optimum image-forming position with respect to the projection optical system 112. Then, in a step 9, the pattern on the reticle 110 is transferred through the projection optical system 112 to the shot area with respect to which leveling and focus adjustment have been conducted in the above-mentioned manner. Subsequently, the above-mentioned operations in the steps 5 to 9 are conducted with respect to each of the remaining shot areas on the wafer 114. When it is determined that exposure has been conducted with respect to all shot areas on the wafer 114 (step 10), the wafer 114 is unloaded from the leveling stage 120. Incidentally, correction of the amount of tilt of the leveling stage 120 (leveling) and adjustment of the height of wafer 114 (focus adjustment) may not be necessarily conducted at the same time. The leveling and the focus adjustment may be conducted in a manner such that when one of these operations is finished, the other operation is conducted.

The stage apparatus and the exposure apparatus used in this embodiment of the present invention are assembled by electrically, mechanically and optically connecting elements capable of constituting a stage apparatus and an exposure apparatus which exert the above-mentioned functions, respectively.

As mentioned above, the exposure method of the present invention is advantageous in that stages produced at low cost can be used and a high throughput can be achieved. Differing from conventional techniques, in the present invention, the accuracy in measurement of the amount of tilt of the stage is not dependent on the degree of precision in machining the stage-driving surface, so that cost of production of stages can be reduced to a low level. Further, because the amount of tilt of the stage is measured and stored as data prior to loading of the photosensitive substrate on the stage and leveling of the stage is conducted after loading of the photosensitive substrate by reading the stored data, it is unnecessary to conduct measurement of the amount of tilt with respect to each photosensitive substrate or each shot area to be subjected to exposure, so that a high throughput can be achieved.

Having described the present invention with reference to preferred embodiments thereof, it is to be understood that the present invention is not limited to the disclosed embodiments, but may be embodied in various other forms without departing from the spirit and the scope of the present invention as defined by the appended claims.

The entire disclosures of Japanese Patent Application No. HEI 8-353269 (353269/1996) and Japanese Patent Application No. HEI 9-091461 (091461/1997) filed on Dec. 16, 1996 and Mar. 26, 1997, respectively, each including specification, claims, drawings and summary, are incorporated herein by reference in their entirety.

What is claimed is:

1. An exposure method for transferring an image of a pattern onto a substrate through a projection system, said substrate being loaded onto a movable stage, the method comprising:

obtaining information on a tilting condition of the movable stage corresponding to a plurality of positions of the movable stage when the movable stage moves to any one of the plurality of positions; and adjusting the tilting condition of the substrate in relation to the movable stage based on the information on the tilting condition of the movable stage when the substrate is exposed.

2. An exposure method according to claim 1, wherein the information on a tilting condition of the movable stage is obtained prior to loading the substrate onto the stage.

3. An exposure method according to claim 1, wherein the plurality of positions are arranged in a matrix.

4. An exposure method according to claim 1, further comprising: storing the obtained information as map data in the moving plane of the movable stage.

5. An exposure method according to claim 1, wherein the information on the tilting condition of the movable stage is obtained by irradiating a measurement beam to a movable stage provided on the movable stage and detecting the measurement beam reflected by the moving mirror.

6. A method for manufacturing a semiconductor device comprising the steps of transferring a devise pattern onto a workpiece by using an exposure method according to claim 1.

7. An exposure apparatus for transferring an image of a pattern onto a substrate loaded on a movable stage through a projection system, the apparatus comprising:

a measuring device that obtains information on a tilting condition of the movable stage corresponding to a plurality of positions of the movable stage when the movable stage moves to any one of the plurality of positions; and a controller that adjusts the tilting condition of the substrate in relation to the movable stage based on the information on a tilting condition of the movable stage when the substrate is exposed, said controller being connected to the measuring device.

8. An exposure apparatus according to claim 7, wherein the information on a tilting condition of the movable stage is obtained prior to loading of the substrate onto the stage.

9. An exposure apparatus according to claim 7, wherein the plurality of positions are arranged in the matrix.

10. An exposure apparatus according to claim 7, further comprising:

a memory that stores the obtained information as map data in the moving plane of the movable stage, said memory being connected to the controller.

11. An exposure apparatus according to claim 7, wherein said measuring device obtains the information on a tilting condition of the movable stage by irradiating a measurement beam to a moving mirror provided on the movable stage, and detecting the measurement beam reflected by the moving mirror.

* * * * *